(12) United States Patent
Yun

(10) Patent No.: US 9,407,173 B2
(45) Date of Patent: Aug. 2, 2016

(54) PIEZO ACTUATOR HAVING AN ELECTRODE STRUCTURE FOR A TORSIONAL VIBRATION MODE, AND ROTATION-TYPE ULTRASONIC MOTOR INCLUDING SAME

(76) Inventor: Man-Sun Yun, Cheongju-si (KR)

( * ) Notice: Subject to any disclaimer, the term of this patent is extended or adjusted under 35 U.S.C. 154(b) by 287 days.

(21) Appl. No.: 13/982,151

(22) PCT Filed: Jun. 23, 2011

(86) PCT No.: PCT/KR2011/004591
§ 371 (c)(1),
(2), (4) Date: Jul. 26, 2013

(87) PCT Pub. No.: WO2012/105734
PCT Pub. Date: Aug. 9, 2012

(65) Prior Publication Data
US 2013/0307376 A1    Nov. 21, 2013

(30) Foreign Application Priority Data

Jan. 31, 2011    (KR) .................. 10-2011-0009774

(51) Int. Cl.
*H01L 41/47*     (2013.01)
*H02N 2/00*      (2006.01)
(Continued)

(52) U.S. Cl.
CPC .............. *H02N 2/001* (2013.01); *B06B 1/0644* (2013.01); *H01L 41/047* (2013.01); *H02N 2/166* (2013.01)

(58) Field of Classification Search
CPC ....... H01L 41/047; H02N 2/166; H02N 2/001
USPC ......... 310/366, 369, 311, 333, 334, 359, 328
IPC ................................... H02N 2/00,2/025, 2/166
See application file for complete search history.

(56) References Cited

U.S. PATENT DOCUMENTS 5,861,704 A * 1/1999 Kitami .................. H01L 41/107
                                                         310/357
7,038,358 B2 * 5/2006 Bryant et al. .................. 310/365
(Continued)

FOREIGN PATENT DOCUMENTS

JP    2006187161    7/2006
JP    2007037271    2/2007
(Continued)

OTHER PUBLICATIONS

International Search Report mailed Feb. 6, 2012 for PCT/KR2011/004591.

*Primary Examiner* — Thomas Dougherty
*Assistant Examiner* — Karen B Addison
(74) *Attorney, Agent, or Firm* — Hauptman Ham, LLP

(57) ABSTRACT

The present invention relates to a piezo actuator having an electrode structure for a torsional vibration mode, and to a rotation-type ultrasonic motor containing the same. In the piezo actuator having the electrode structure, electrodes may have different lengths from the center point of the piezo actuator in order to form an electrode structure having a pinwheel shape for enabling a torsional vibration mode. Thus, since the electrodes of the piezo actuator for generating torsional vibrations has a simple pinwheel wing structure, a rotor coupled along a groove formed in the side surface of the piezo actuator may be rotated using the torsional directional vibrations due to the electrode structure.

19 Claims, 14 Drawing Sheets

(a)

(b)

(c)

(d)

(51) Int. Cl.
*H01L 41/047* (2006.01)
*B06B 1/06* (2006.01)
*H02N 2/16* (2006.01)

(56) References Cited

U.S. PATENT DOCUMENTS 7,670,335 B2 * 3/2010 Keidar ............... A61B 17/2202
310/369
7,932,663 B2 * 4/2011 Yoon .................. H05B 41/2822
310/359
2005/0275318 A1 12/2005 Maruyama et al.
2011/0074253 A1 * 3/2011 Hino ....................... F03G 7/005
310/365

FOREIGN PATENT DOCUMENTS

| | | |
|---|---|---|
| JP | 2010246347 | 10/2010 |
| KR | 100772274 | 11/2007 |
| TW | 200812213 A | 3/2008 |
| TW | 201031105 A | 8/2010 |

* cited by examiner

Fig. 15
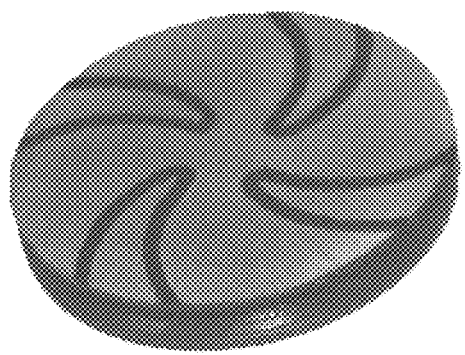
(a)
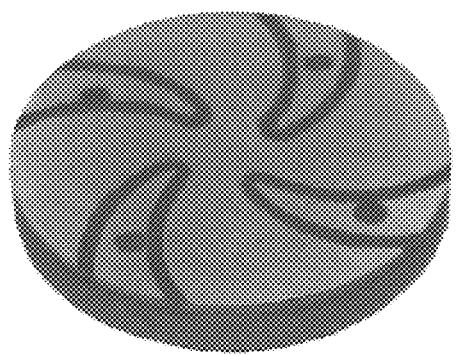
(b)
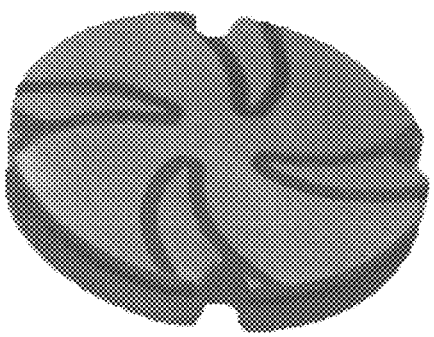
(c)
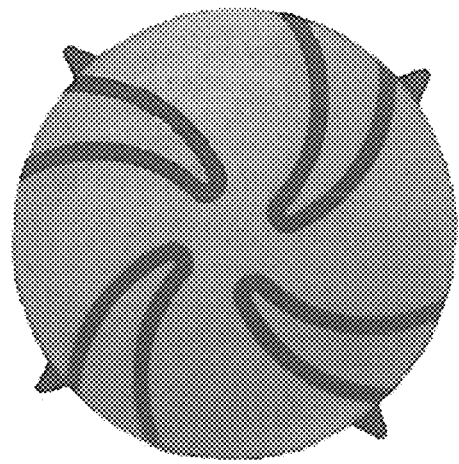
(d)

800

PIEZO ACTUATOR HAVING AN ELECTRODE STRUCTURE FOR A TORSIONAL VIBRATION MODE, AND ROTATION-TYPE ULTRASONIC MOTOR INCLUDING SAME

TECHNICAL FIELD

The present invention relates to a piezoelectric actuator having a pinwheel wing-shaped electrode structure which can be operated in a torsional vibration mode by varying the lengths of electrode wings from a central point of the piezoelectric actuator and a rotation type ultrasonic motor including the same, and more particularly, to a technology of forming a piezoelectric actuator having an electrode divided into pinwheel wings in a plate-shaped body formed of a piezoelectric material to generate torsional vibration along a side surface of the piezoelectric actuator and to drive a ring-shaped rotor, and an ultrasonic motor of a simple structure.

BACKGROUND ART

Rotary ultrasonic motors using piezoelectric materials were studied by H. V Barth of the United States in 1973, V. V Lavrinenco of the Soviet Union in 1973, Sashida of Japan, etc.

A representative rotary ultrasonic motor is a single-phase rotary motor developed by Physik Instrumente (PI).

FIG. 1 is a schematic view of a rotary ultrasonic motor in the art.

Referring to FIG. 1, a rotor 30 is placed above a cylindrical piezoelectric actuator 10 placed at the center of the motor. A semispherical pusher 20 is placed between the rotor 30 and the piezoelectric actuator 10 to minimize friction while allowing smooth rotation.

Further, the rotary ultrasonic motor includes a shaft 40 for transferring motion of the rotor 30 outside, a base 50 for supporting the shaft 40, a spider spring 60, and a coupling ring 70.

All of these components may be protected by a cylindrical case 80.

Here, in order to generate vibration on a tangential axis with the rotor 30, the piezoelectric actuator 10 is divided into a plurality of electrodes (free electrodes and active electrodes) along an outer surface of the piezoelectric actuator 10. The detailed shape of the piezoelectric actuator 10 and vibration simulation thereof are as follows.

FIGS. 2 and 3 are schematic views showing an operational principle of the ultrasonic motor based on computer simulation.

Referring to FIGS. 2 and 3, the cylindrical piezoelectric actuator 10 has electrodes which are divided at constant intervals, and the piezoelectric actuator 10 expands in a thickness direction at electrode sections (active electrode sections) to which voltage is applied and maintains its original shape at electrode sections (free electrode sections) adjacent to the active electrode sections.

Thus, as shown, a simulated shape 90 of the piezoelectric actuator having a waveform is obtained. As can be seen from the simulated shape, the rotor is rotated in a direction in which the semispherical pushers 20 are inclined.

However, it is difficult to commercialize this type of ultrasonic motor due to its low efficiency.

Thus, T. Sashida developed an ultrasonic motor using traveling waves in 1982.

FIGS. 4 and 5 are schematic views of an ultrasonic motor using traveling waves in the art.

FIGS. 4 and 5 show a principle of rotating a rotor 35 by traveling waves formed from two standing waves in an annular piezoelectric actuator 15.

In addition, the ultrasonic motor includes common components such as a shaft 45, base 55, bearing 65, and case 85, and detailed descriptions thereof will be omitted.

As described above, unlike an electromagnetic motor generating drive power by interaction between electric current and a magnetic field, the ultrasonic motors in the art converts friction between a stator (piezoelectric actuator) vibrating due to ultrasonic waves and a mover into rotational force.

It is known that energy density of ultrasonic vibration energy theoretically reaches several hundreds of $W/cm^2$, which is 5 to 10 times higher than conventional electric magnetic motors, and the ultrasonic motor has an advantage of generating high torque at low speed without generating EMI.

However, since the ultrasonic motor has a complex structure and requires high precision components, manufacture of the ultrasonic motor is troublesome, and it is difficult to achieve mass production and miniaturization of the ultrasonic motors.

DISCLOSURE

Technical Problem

It is an aspect of the present invention to provide an ultrasonic motor that includes a piezoelectric actuator having a pinwheel wing-shaped electrode structure that can be operated in a torsional vibration mode by varying lengths of electrode wings from a central point of the piezoelectric actuator and a rotor rotated along a side surface of the piezoelectric actuator, thereby providing a simpler structure than ultrasonic motors in the art.

It is another aspect of the present invention to provide a rotation type ultrasonic motor having a simple structure that facilitates mass production by machining a body of a piezoelectric actuator through powder pressing or by easily forming a final shape of the body of the piezoelectric actuator through injection molding of powder.

Technical Solution

In accordance with one embodiment of the present invention, a piezoelectric actuator for an ultrasonic motor includes: a plate-shaped body formed of a piezoelectric material; a first electrode having a pinwheel wing shape formed on one of upper and lower surfaces of the plate-shaped body and operable in a torsional vibration mode by varying lengths of the electrode wings from a central point of the piezoelectric actuator; a plurality of second electrodes formed between the pinwheel wings to be separated from the first electrodes; a third electrode formed on a surface opposite the surface on which the first electrode and the plurality of second electrodes are formed; and a side groove formed in a circular shape along a side surface of the plate-shaped body.

The piezoelectric actuator further includes at least one of:
i) a hole passing through the plurality of second electrodes, the plate-shaped body, and the third electrode;
ii) a vertical groove formed by cutting edges of the plurality of second electrodes, the plate-shaped body, and the third electrode at the same time; and
iii) a boss formed on the side surface of the plate-shaped body.

In addition, an ultrasonic motor according to a first embodiment of the invention includes the aforementioned piezoelectric actuator; a ring-shaped rotor mounted on the side groove of the piezoelectric actuator; an input wire bonded to at least one of the first electrode and the plurality of second electrodes of the piezoelectric actuator; an output wire bonded to an electrode of the first electrode and the plurality of second electrodes to which the input wire is not bonded; and an input/output common wire bonded to the third electrode.

Further, an ultrasonic motor according to a second embodiment of the invention includes: a plate-shaped body formed of a piezoelectric material; a first electrode having a pinwheel wing shape and formed on one of upper and lower surfaces of the plate-shaped body; a plurality of second electrodes formed between the pinwheel wings to be separated from the first electrode; a third electrode formed on a surface opposite the surface on which the first electrode and the plurality of second electrodes are formed; a side groove formed in a circular shape along a side surface of the plate-shaped body; a ring-shaped rotor mounted on the side groove; and through-holes formed through the plurality of second electrodes to guide voltage applying wires bonded to the first electrode and the plurality of electrodes to a lower side of the plate-shaped body to allow smooth rotation of the wires, wherein the wires are bonded to the first and second electrodes such that an input voltage is applied to all of the plurality of second electrodes, or an input voltage is applied to some of the first electrode and the plurality of second electrodes and an output voltage is obtained from the remaining second electrodes, and an electric wire for applying an input/output common voltage is connected to the third electrode.

Further, an ultrasonic motor according to a third embodiment of the invention includes: a plate-shaped body formed of a piezoelectric material; a first electrode having a pinwheel wing shape formed on one of upper and lower surfaces of the plate-shaped body; a plurality of second electrodes formed between the pinwheel wings to be separated from the first electrode; a third electrode formed on a surface opposite the surface on which the first electrode and the plurality of second electrodes are formed; a side groove formed in a circular shape along a side surface of the plate-shaped body; a ring-shaped rotor mounted on the side groove; and vertical grooves formed at edges of the plurality of second electrodes to guide vertical grooves formed at edges of the plurality of second electrodes to guide electric wires bonded to the first electrode and the plurality of electrodes to a lower side of the plate-shaped body to allow smooth rotation of the wires, wherein the wires are bonded to the first and second electrodes such that an input voltage is applied to all of the plurality of second electrodes, or an input voltage is applied to some of the first electrode and the plurality of second electrodes and an output voltage is obtained from the remaining second electrodes, and an electric wire for applying an input/output common voltage is connected to the third electrode.

Further, an ultrasonic motor according to a fourth embodiment of the invention includes: a plate-shaped body formed of a piezoelectric material; a first electrode having a pinwheel wing shape formed on one of upper and lower surfaces of the plate-shaped body; a plurality of second electrodes formed between the pinwheel wings to be separated from the first electrode; a third electrode formed on a surface opposite the surface on which the first electrode and the plurality of second electrodes are formed; a boss formed along a side surface of the plate-shaped body to increase rotational force when torsion is applied to the plate-shaped body; and a ring-shaped rotor mounted on the side groove and surrounding boss, wherein the wires are bonded thereto such that an input voltage is applied to all the plurality of second electrodes, or an input voltage is applied to some of the first electrode and the plurality of second electrodes and an output voltage is obtained from the remaining second electrode, and an electric wire for applying an input/output common voltage is connected to the third electrode.

Advantageous Effects

According to the present invention, a pinwheel wing-shaped electrode structure can be vibrated in a torsional direction by varying the lengths of electrodes from a central point of a piezoelectric actuator. Thus, a simple rotary motor can be manufactured.

Further, by varying the lengths of the electrodes from the central point of the piezoelectric actuator, some of pinwheel-shaped upper electrodes operable in a torsional vibration mode are used for rotation and the remaining electrodes obtain electric energy, thereby providing an ultrasonic motor having a new structure capable of saving energy.

DESCRIPTION OF DRAWINGS

FIG. 15 shows pictures of the piezoelectric actuators according to the embodiments of the present invention.

BEST MODE

Figure 1:
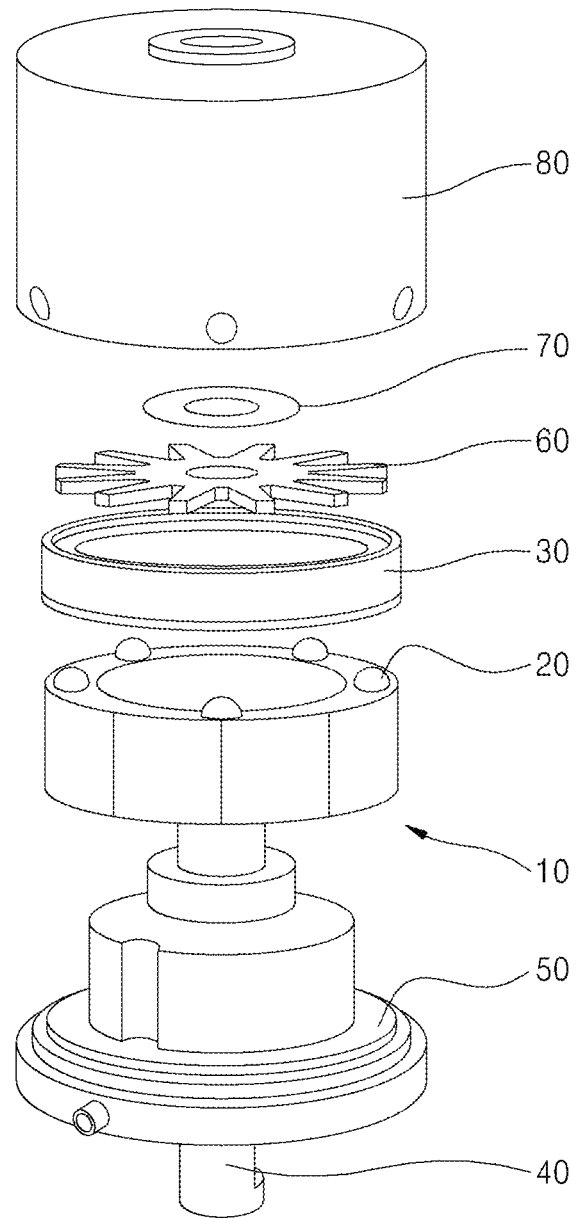
FIG. 1 is a schematic view of a structure of a rotary ultrasonic motor in the art.
Figure 2:
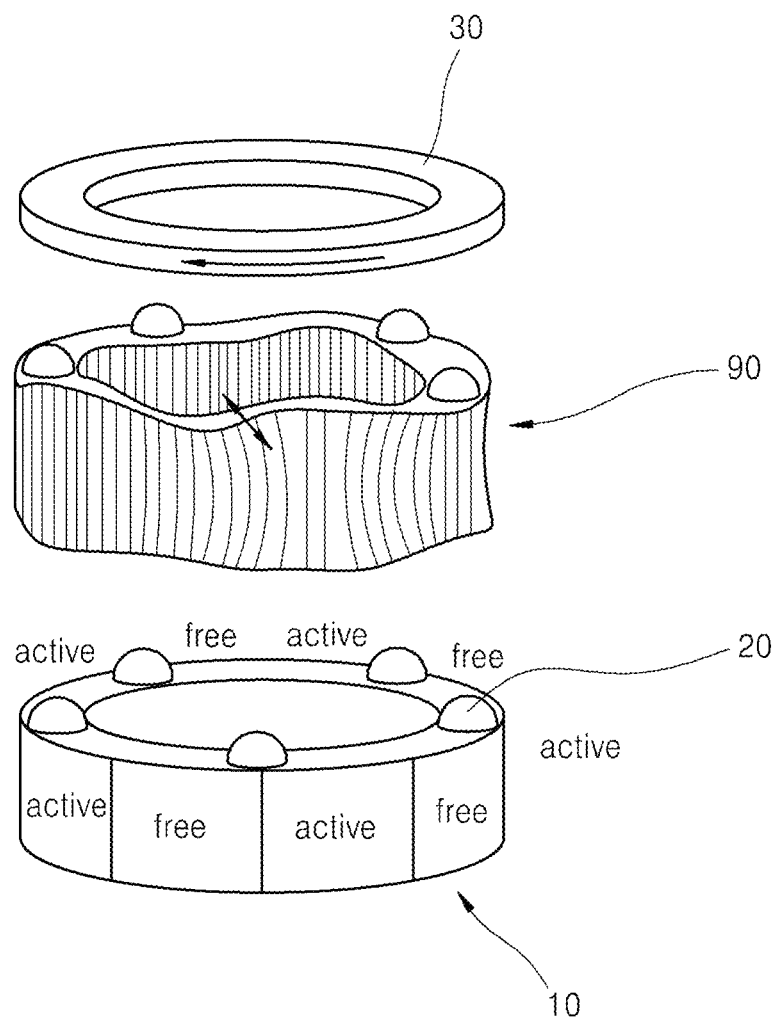
FIGS. 2 and 3 are schematic views showing an operational principle of an ultrasonic motor through computer simulations.
Figure 3:
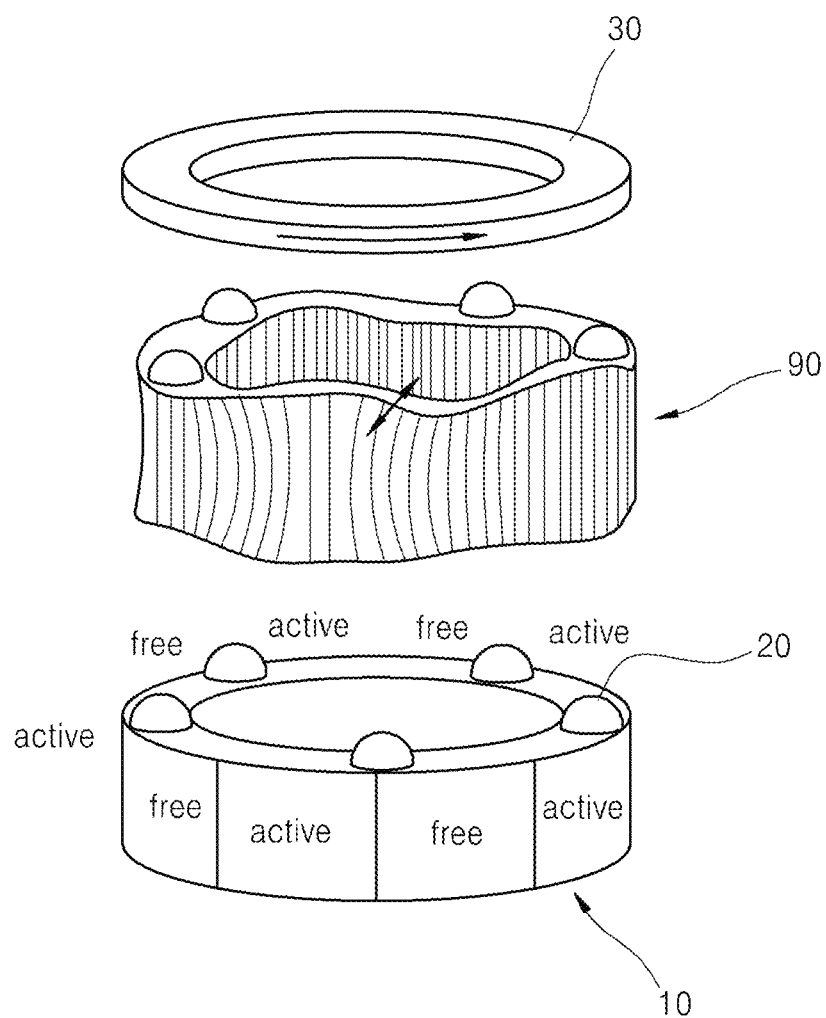
Figure 4:
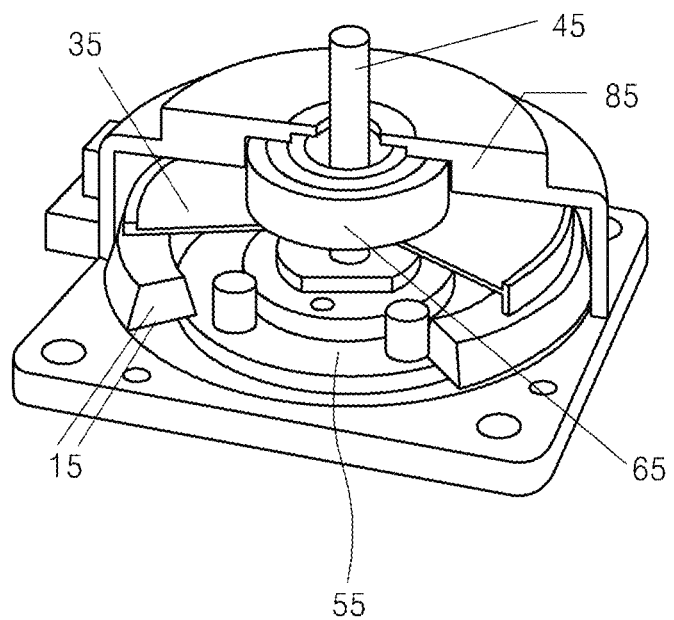
FIGS. 4 and 5 are schematic views of an ultrasonic motor using traveling waves in the art.
Figure 5:
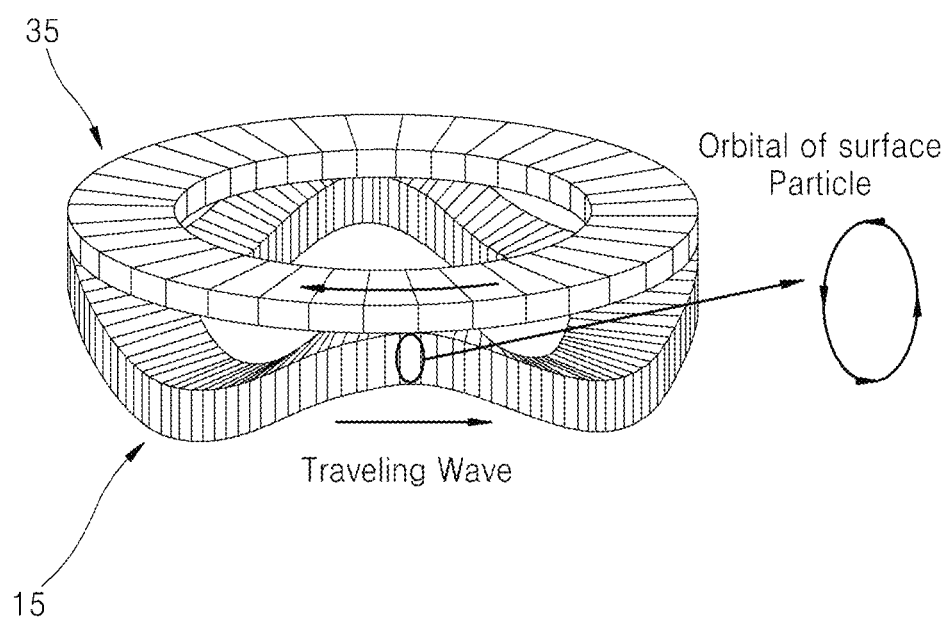

The above and other aspects, features, and advantages of the present invention will become apparent from the detailed description of the following embodiments in conjunction with the accompanying drawings. It should be understood that the present invention is not limited to the following embodiments and may be embodied in different ways, and that the embodiments are provided for complete disclosure and thorough understanding of the invention by those skilled in the art. The scope of the present invention is defined only by the claims. Like components will be denoted by like reference numerals throughout the specification.

Now, a piezoelectric actuator having a pinwheel wing-shaped electrode structure which can be operated in a torsional vibration mode by varying lengths of electrodes from a central point of the piezoelectric actuator, and a rotation type ultrasonic motor including the same will be described in detail.

FIGS. 6 to 9 are schematic views of piezoelectric actuators and methods for manufacturing the same according to embodiments of the present invention.

FIG. 6(a) shows an upper electrode of a piezoelectric actuator 100 according to one embodiment, and FIG. 6(b) shows a lower electrode of the piezoelectric actuator 100.

The piezoelectric actuator 100 according to this embodiment has a disc-shaped body 170 formed of a piezoelectric material.

The body 170 is not necessarily limited to a disc shape, and the present invention is not limited by its planar form.

Here, as shown in FIG. 6(c), the piezoelectric actuator 100 according to the embodiment has a side groove 180 formed on a side surface thereof to mount a vibrating element, and an entire circumference of the side groove 180 has a circular form to normally generate rotational force.

In addition, the overall configuration of the piezoelectric actuator is formed by machining the body of the piezoelectric actuator through powder press, or the final shape of the piezoelectric actuator is formed through injection molding of powder, thereby facilitating the manufacturing process.

Next, electrodes are formed on a surface of the body 170.

First, as shown in FIG. 6(a), the electrodes are formed on an upper surface of the body such that the electrodes have different lengths from the central point of the piezoelectric actuator. Through this operation, a pinwheel wing-shaped first electrode 110 operable in a torsional vibration mode is formed, and a plurality of second electrodes 120, 130, 140, 150 separated from the pinwheel wing-shaped first electrode 110 is formed in areas between the pinwheel wings.

Next, as shown in FIG. 6(b), a lower third electrode 160 is formed on a lower surface of the body.

Here, by varying the lengths of electrode wings from a central point of the piezoelectric actuator, the pinwheel wing-shaped first electrode 110 operable in a torsional vibration mode may be in the form of being rotated in one direction and pinwheel wings of the first electrodes are separated from each other.

Although the pinwheel shape of the piezoelectric actuator operable in a torsional vibration mode is in the form of being rotated in the counterclockwise direction by varying the lengths of the electrodes from the piezoelectric actuator, the present invention is not limited thereto, and the pinwheel shape of the piezoelectric actuator may be in the form of being rotated in the clockwise direction.

In addition, input voltage is applied to the first electrode 110 and the plurality of second electrodes 120, 130, 140, 150, or input voltage is applied only to the first electrode 110, which is an internal electrode, and output voltage is obtained from the plurality of second electrodes 120, 130, 140, 150, which are external electrodes. Further, the lower third electrode 160 is integrally formed and connected to a common ground, instead of being divided into several portions.

Here, it should be understood that a method of connecting an input voltage to an output voltage is merely an example, and may be realized in various ways. For example, input voltages may be applied only to some of the plurality of divided second electrodes 120, 130, 140, 150 of the upper electrode and output voltages may be obtained from the internal first electrode 110 having a pinwheel shape and the remaining second electrodes. Further, the area ratio of the internal first electrode 110 to the plurality of external second electrodes 120, 130, 140, 150 may be changed, and their thicknesses also may be changed.

Figure 6:
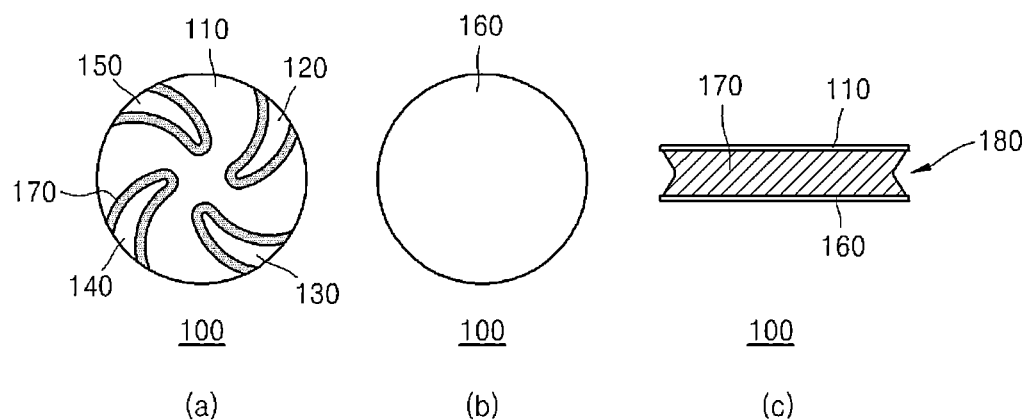
FIGS. 6 to 9 are schematic views of piezoelectric actuators and a method for manufacturing the same according to embodiments of the present invention.
Figure 7:
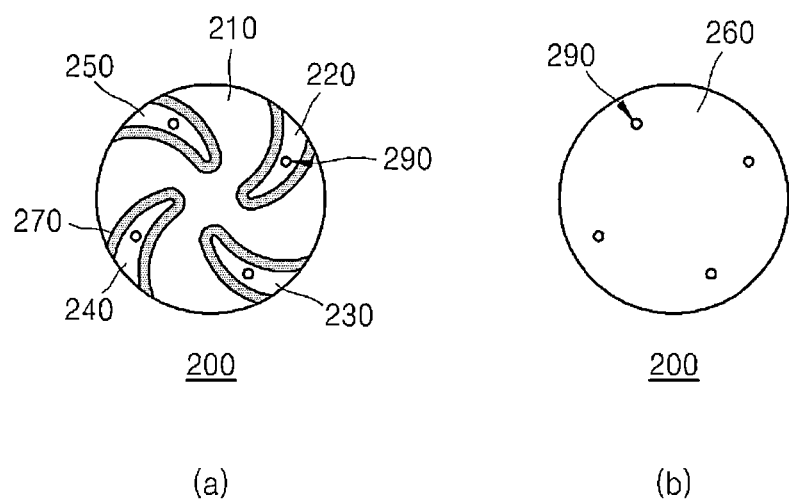

In the description of the drawings, items indicated by FIG. 6(a) and FIG. 6(b) actually refer to Part (a) shown in FIG. 6. However, they are indicated in an abbreviated form for convenience and will be applied in the same way in the following description.

Next, the basic form of a piezoelectric actuator 200 of FIGS. 7(a) and 7(b) corresponds to that of the piezoelectric actuator 100 of FIG. 6.

The piezoelectric actuator is formed with symmetrically arranged through-holes 290 which guide an electric wire to a lower side of the piezoelectric actuator, wherein the electric wire is bonded to an upper electrode to apply voltage to a plurality of second electrodes 220, 230, 240, 250, which are the upper electrodes.

In addition, as in the embodiment of FIG. 6, the forms of input and output voltages applied to a first electrode 210 and the plurality of second electrodes 220, 230, 240, 250 may be changed, and the forms of the electrodes may also be modified in various ways.

Figure 8:
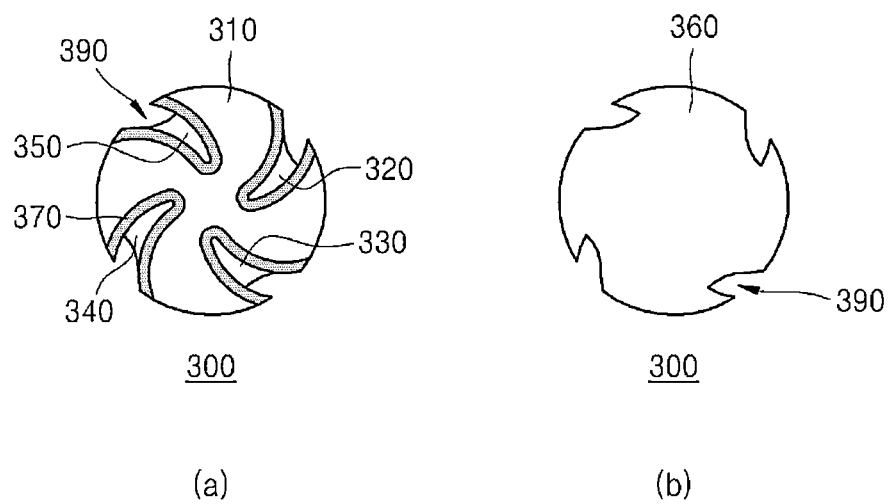

Next, a piezoelectric actuator 300 shown in FIGS. 8(a) and 8(b) basically has the same configuration as that of the piezoelectric actuator 100 of FIG. 6. In this embodiment, the piezoelectric actuator 300 shown in FIG. 8 guides an electric wire, which is bonded to an upper electrode to apply voltage thereto, from an edge to a lower side thereof. Further, the piezoelectric actuator 300 shown in FIG. 8 includes vertical grooves arranged at constant intervals and in a predetermined shape along the circumference of the piezoelectric actuator 300 to improve a torsional vibration mode.

Figure 9:
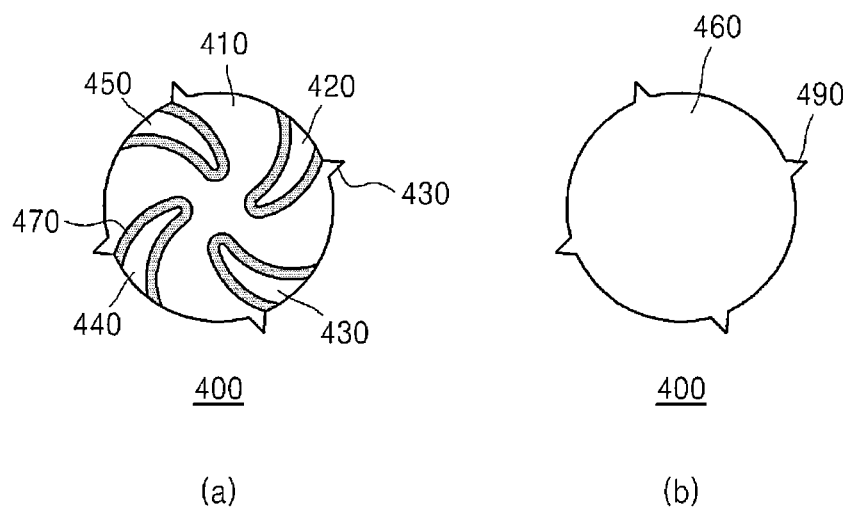

Next, a piezoelectric actuator 400 shown in FIGS. 9(a) and 9(b) basically has the same form as that of the above-described piezoelectric actuator 100 of FIG. 6. In this embodiment, the piezoelectric actuator shown in FIG. 9 has bosses 490 symmetrically arranged along a side surface of the body instead of the side groove 180 shown in FIG. 6. The bosses 490 may secure a rotor and serves to transfer rotational force to the rotor in a torsional vibration mode.

In the embodiment of FIG. 9, the piezoelectric actuator 400 may further include a side groove. However, when the piezoelectric actuator 400 includes the side groove, it is not easy to form the bosses 490 inside a V-shaped groove. Thus, when the side groove is provided in the embodiment of FIG. 9, an attachment surface may be configured to allow the bosses 490 to be secured to the V-shaped groove.

In addition, since a space is defined between the piezoelectric actuator 400 and the rotor by the bosses 490 in this embodiment, an electric wire may be guided to a lower side through the space.

As described above, each of the piezoelectric actuators 100; 200; 300; 400 according to the embodiments of the invention basically includes the pinwheel wing-shaped first electrode 110; 210; 310; 410, and a plurality of divided second electrodes 120, 130, 140, 150; 220, 230, 240, 250; 320, 330, 340, 350; 420, 430, 440, 450, and further include at least one of the through-holes 290, the vertical grooves 390, and the bosses 490 to guide the electric wire to the lower side.

Figure 10:
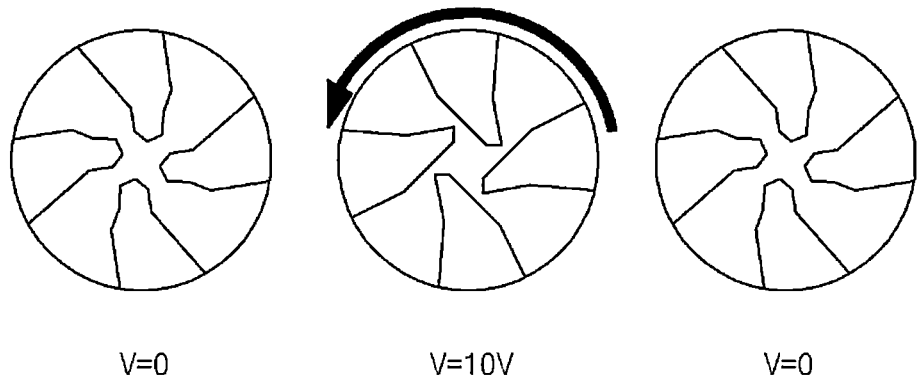
FIGS. 10 to 13 are simulation views of torsional vibration in a resonance frequency according to embodiments of the present invention.
Figure 11:
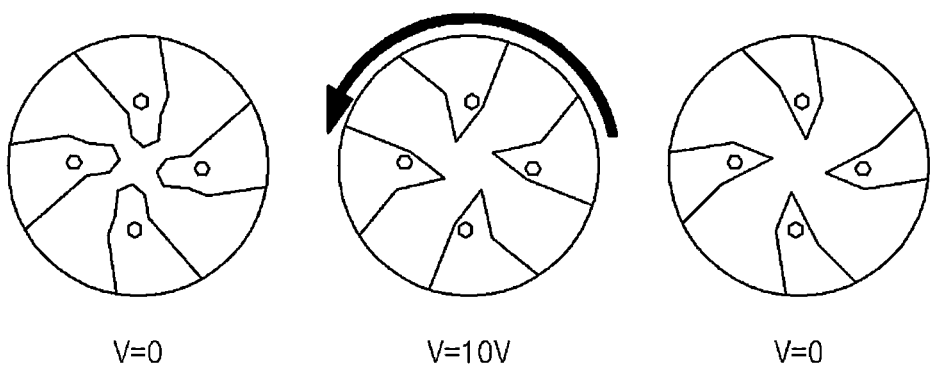
Figure 12:
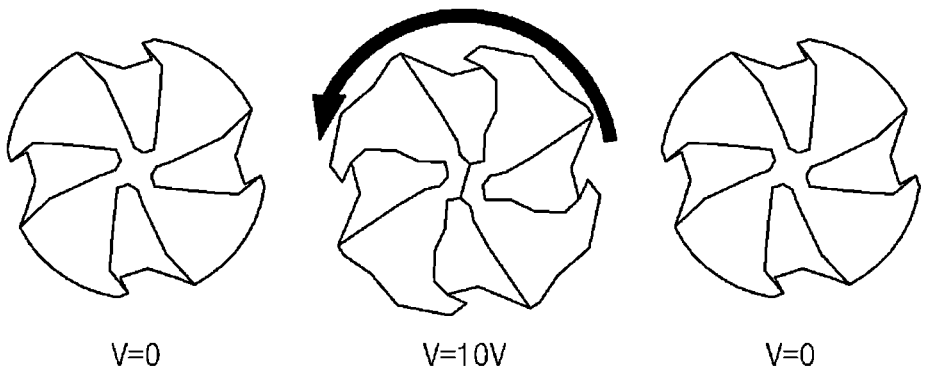
Figure 13:
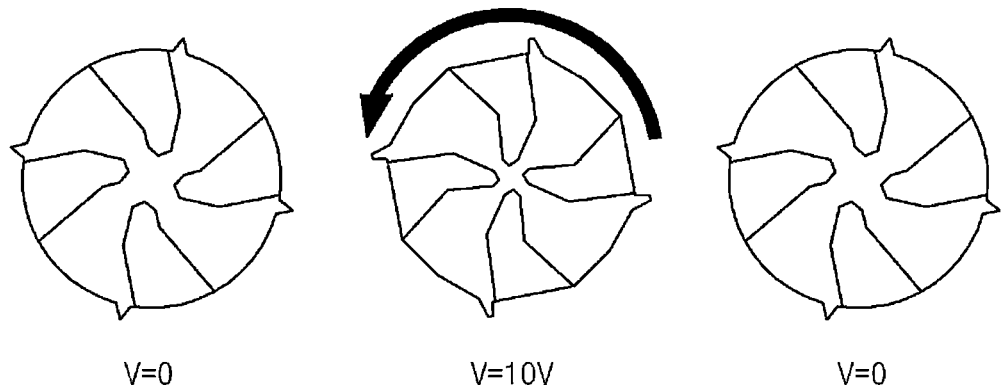

Next, FIGS. 10 and 13 are simulation diagrams showing torsional vibration in resonance frequencies according to embodiments of the present invention.

Here, a voltage (Vo-p=10 V) was applied at a resonance frequency of 330 kHz having a single polarity, and torsional vibration was generated only in the counterclockwise direction.

Referring to FIGS. 10 to 13, it can be seen from finite element analysis that torsional vibration was present. This was caused by a pinwheel wing-shaped electrode structure operable in a torsional vibration mode by varying the lengths of electrode wings from the central point of the piezoelectric actuator.

In particular, referring to FIG. 13, when the bosses are formed along a side surface of the disc-shaped piezoelectric actuator as shown, the bosses contacting the rotor are inclined in the counterclockwise direction according to the torsional vibration of the piezoelectric actuator. It can be seen that the rotor in contact with the bosses is rotated in the counterclockwise direction by friction.

Figure 14:
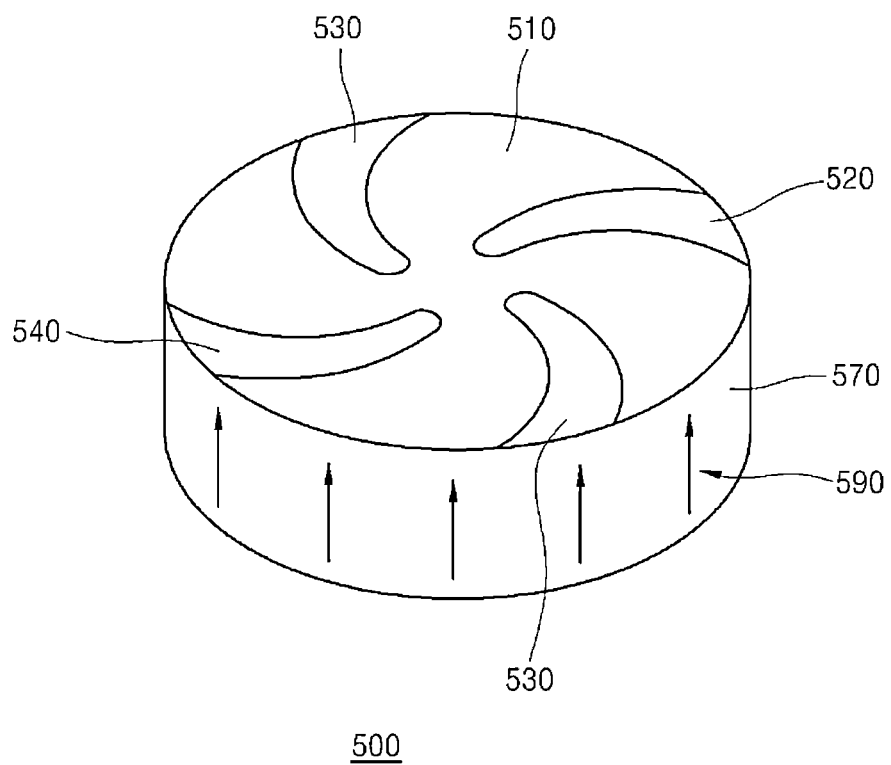
FIG. 14 is a perspective view of a polarization direction of a piezoelectric actuator according to one embodiment of the present invention.

Next, FIG. 14 is a perspective view of a polarization direction of a piezoelectric actuator according to one embodiment of the present invention.

Referring to FIG. 14, a piezoelectric actuator 500 according to this embodiment includes a pinwheel wing-shaped first electrode 510 operable in a torsional vibration mode by varying the lengths of electrode wings from the central point of the piezoelectric actuator, and a plurality of divided second electrodes 520, 530, 540, 550, a polarization direction 590 with respect to a side surface of a body 570 is formed in a thickness direction of the piezoelectric actuator.

In the piezoelectric actuator 500 according to this embodiment, piezoelectric vibration is generated in the polarization direction 590 and rotational force is generated by the piezoelectric vibration.

Next, FIG. 15 shows pictures of the piezoelectric actuators according to the embodiments of the present invention.

FIG. 15 corresponds to actual experimental samples of FIGS. 6 to 9. FIG. 15(a) corresponds to a sample of FIG. 6, FIG. 15(b) corresponds to a sample of FIG. 7, FIG. 15(c) corresponds to a sample of FIG. 8, and FIG. 15(d) corresponds to a sample of FIG. 9.

First, referring to FIG. 15(a), an upper electrode has the same planar structure as that of a body and is divided into a pinwheel shape. Further, input voltage may be applied by any one of two methods, that is, the method of applying the input voltage to some of the divided electrodes, or the method of applying the input voltage to all of the electrodes.

When input voltage is applied to some electrodes, output voltage may be obtained from the other electrodes by an effect of converting vibration energy of the piezoelectric body into electric energy to obtain energy.

In addition, grooves for mounting a rotor are formed on a side surface of the piezoelectric actuator.

Next, referring to FIG. 15(b), the piezoelectric actuator is formed with symmetrically arranged four through-holes for guiding an electric wire which guide an electric wire to a lower side of the piezoelectric actuator, wherein the electric wire is bonded to a pinwheel-shaped upper electrode of the piezoelectric actuator to apply voltage thereby so as to efficiently utilize rotation of the upper electrode.

Next, as in the above embodiment, input voltage may be applied by any one of two methods, that is, the method of applying the input voltage to some of the divided electrodes, or the method of applying the input voltage to all of the electrodes.

When input voltage is applied to some electrodes, output voltage may be obtained from the other electrodes by an effect of converting vibration energy of the piezoelectric body into electric energy to obtain energy.

Further, grooves for mounting a rotor are formed on a side surface of the piezoelectric actuator.

Next, referring to FIG. 15(c), vertical grooves for guiding an electric wire to a lower side to efficiently use rotation of the upper electrode are formed to apply voltage to the pinwheel-shaped upper electrode of the piezoelectric actuator while improving a torsional mode in the circumferential direction of the piezoelectric actuator.

Further, as in the above embodiment, input voltage may be applied by any one of two methods, that is, the method of applying the input voltage to some of the divided electrodes, or the method of applying the input voltage to all of the electrodes.

When input voltage is applied to some electrodes, output voltage may be obtained by an effect of converting vibration energy of the piezoelectric body into electric energy to obtain energy.

Further, grooves for mounting the rotor is formed on a side surface of the piezoelectric actuator.

Next, referring to FIG. 15(d), bosses are formed on the side surface of the piezoelectric actuator such that rotational force applied to the bosses when the pinwheel wing-shaped electrode vibrates in a torsional mode can be used. Further, the rotor is mounted on the bosses while contacting the bosses.

Next, one example of the rotor will be described as follows.

Figure 16:
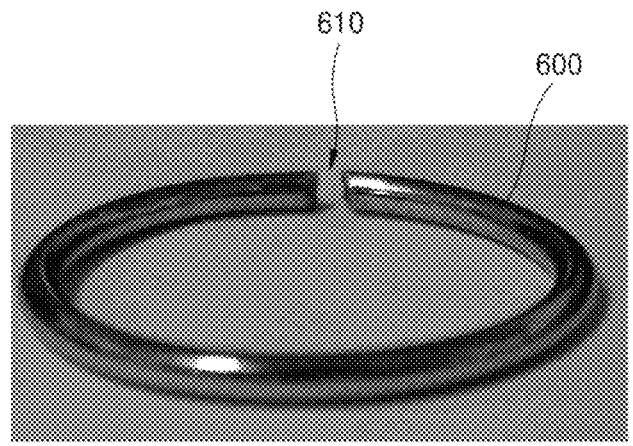
FIG. 16 shows a picture of a rotor according to one embodiment of the present invention.

FIG. 16 shows a picture of a rotor according to one embodiment of the invention.

Referring to FIG. 16, a rotor 600 according to one embodiment of the invention has an annular spring shape. In FIG. 16(a), coupling force of the rotor 600 with the piezoelectric actuator is adjusted by the spring constant. The rotor 600 shown in FIG. 16(a) has a cutaway portion 610 and may be easily mounted along the grooves or bosses on the side surface of the piezoelectric actuator.

Figure 17:
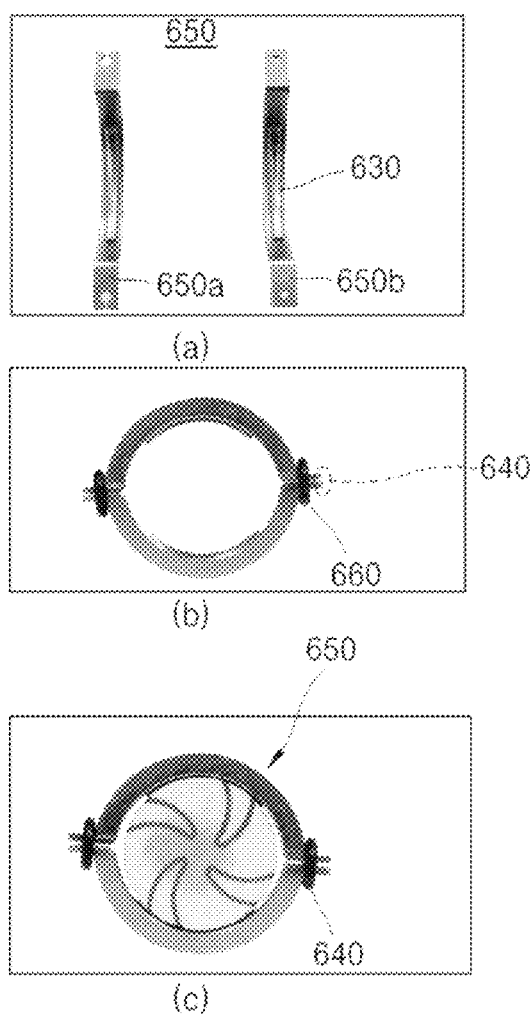
FIG. 17 shows a picture of a rotor according to another embodiment of the present invention.

Next, FIG. 17 shows a picture of a rotor according to another embodiment of the present invention.

Referring to FIG. 17, a rotor 650 according to this embodiment includes two separated symmetrical semi-annular rotors 650a, 650b. Inner bosses 630 which can be inserted into side grooves of the disc-shaped piezoelectric actuator are formed on an inner surface of each of the semi-annular rotors 650a, 650b.

A securing boss 640 is formed at a coupling portion of each of the semi-annular rotors 650a, 650b to protrude from the circumference thereof in order to fasten each of the semi-annular rotors. Thus, the securing boss is secured to the side groove of the piezoelectric actuator by coupling the securing bosses 640 to a securing ring 660 such as a resilient rubber or a spring after the semi-circular rotor is coupled to the piezoelectric actuator.

Figure 18:
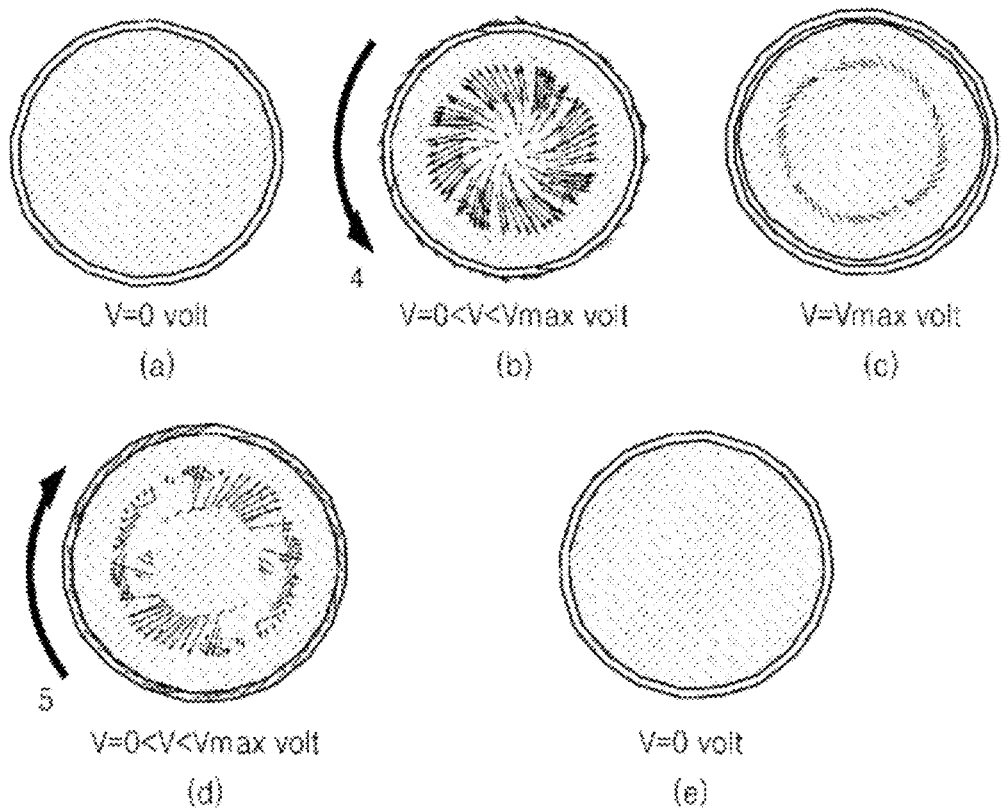
FIG. 18 is a simulation view of a driving principle of an ultrasonic motor having a simple shape according to the present invention.

FIG. 18 is a simulation view of a drive principle of an ultrasonic motor having a simple shape according to the present invention.

FIG. 18 exemplifies a disc-shaped piezoelectric actuator and shows displacement of the piezoelectric actuator using fine arrows in the disc through finite element analysis.

First, when voltage is not applied (a: V=0 volt) as in FIG. 18(a), the annular rotor and the disc-shaped piezoelectric actuator are in close contact with each other by a predetermined pressure.

Next, when a voltage starts to be applied as in FIG. 18(b), a displacement vector is generated in the counterclockwise direction by torsional mode vibration, pushing out the rotor in the counterclockwise direction.

Then, when the voltage reaches a maximum point (V=Vmax) as in FIG. 18(c), radial contraction of the rotor reaches maximum, contracting the disc-shaped piezoelectric actuator.

Next, when the voltage is reduced again as in FIG. 18(d), radial contraction of the rotor is reduced, generating twisting of the rotor in the clockwise direction.

Next, when the rotor starts to be radially expanded and the applied voltage falls to zero (that is, V=0 volt), the rotor returns to an original state as in FIG. 18(e).

As this operation is repeated, the rotor is rotated in the counterclockwise direction.

Figure 19:
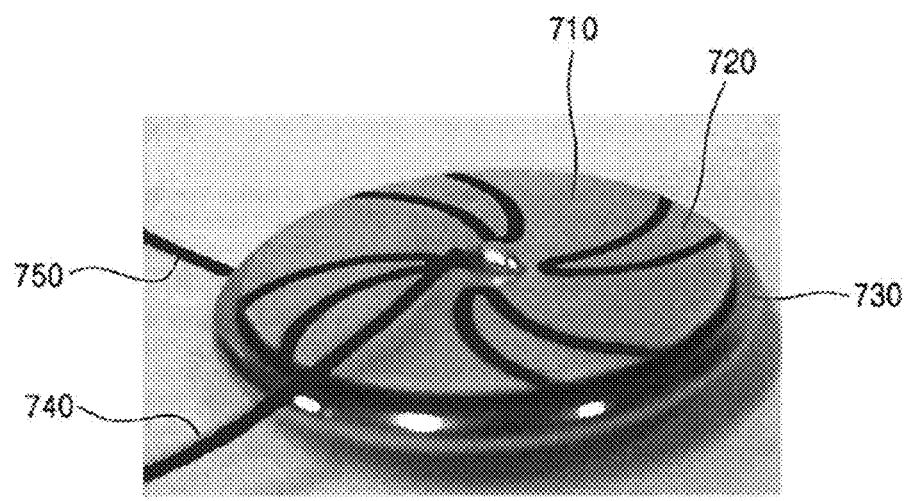
FIGS. 19 and 20 are simple pictures of wires provided to the ultrasonic motors according to the present invention.
Figure 20:
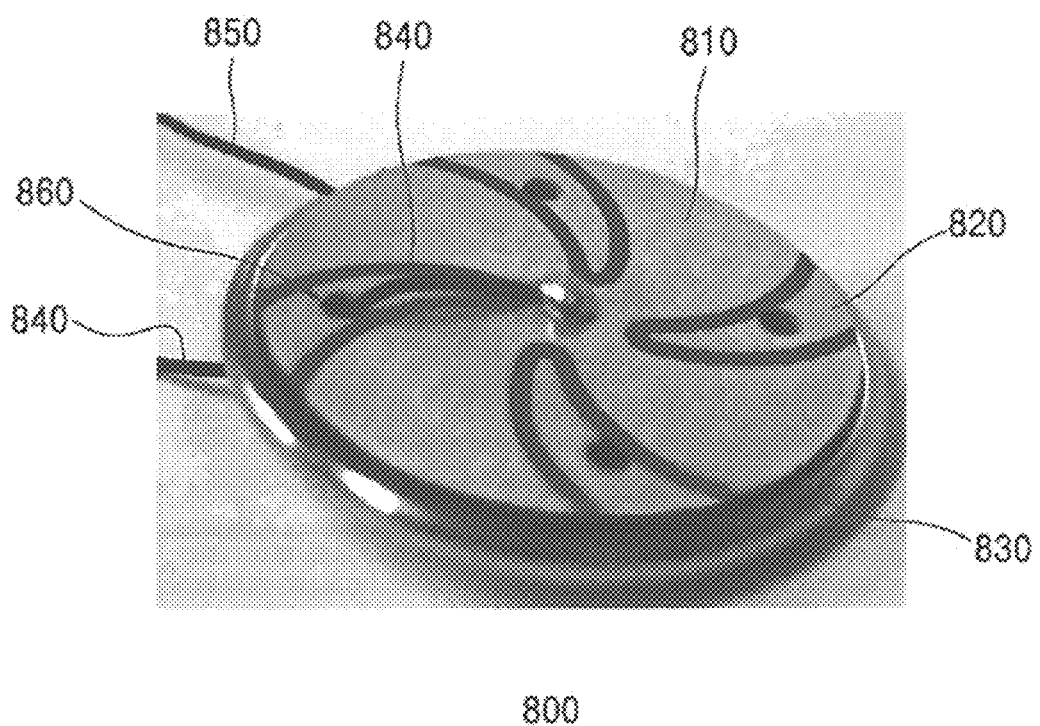

FIGS. 19 and 20 are simple pictures of wires provided to the ultrasonic motors according to the present invention.

FIG. 19 shows an upper input voltage applying wire 740 and a lower input/output common voltage applying wire 750 coupled to the piezoelectric actuator 700, the rotor 730 and the first electrode 710.

FIG. 20 shows that an upper input voltage applying wire 840 bonded to a first electrode 810 is guided through a through-hole 860 formed in the piezoelectric actuator 800 such that the upper input voltage applying wire faces a lower electrode.

Here, since torsional vibration is generated in the entirety of the piezoelectric actuator 800, the wire 840 is advantageously rotated.

Figure 21:
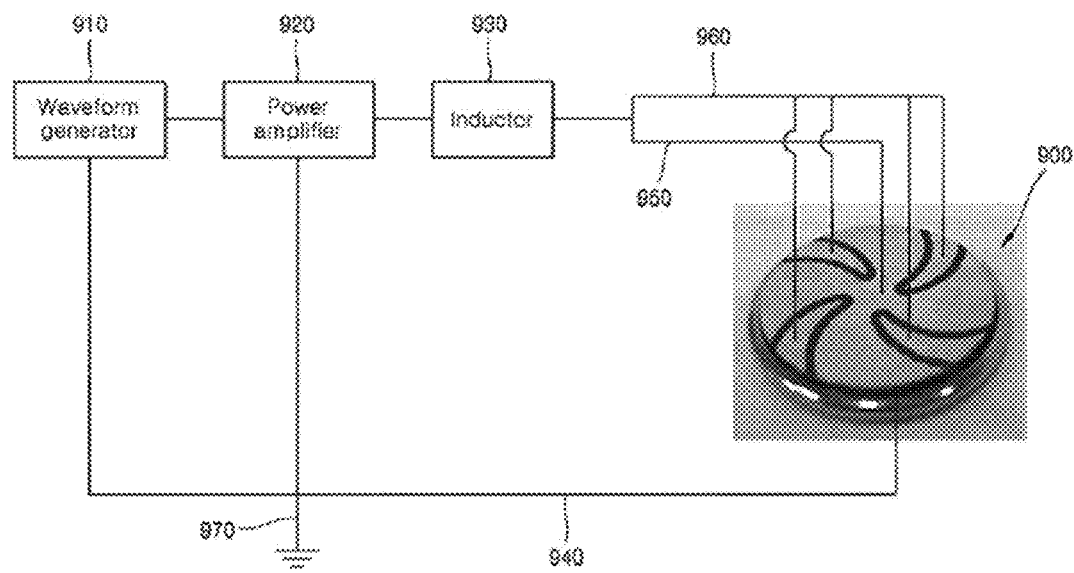
FIG. 21 is a block diagram of a system for driving an ultrasonic motor having a simple shape according to one embodiment of the present invention.

FIG. 21 is a block diagram of a system for driving an ultrasonic motor having a simple shape according to one embodiment of the present invention.

Referring to FIG. 21, the system according to this embodiment includes a waveform generator 910, a power amplifier 920, and an inductor 930 for impedance matching with a piezoelectric actuator 900 constituting an ultrasonic motor.

Here, the waveform generator 910 has a function of generating a secondary resonance frequency of the piezoelectric actuator 900 and selecting a suitable waveform. The power amplifier 920 serves to increase or decrease voltage applied to the piezoelectric actuator 900 and is connected to a ground terminal 970.

In addition, the system according to this embodiment further includes an input voltage applying wire 950, an input/output common voltage applying wire 940, and an output voltage applying wire 960 according to a drive type of the ultrasonic motor.

Figure 22:
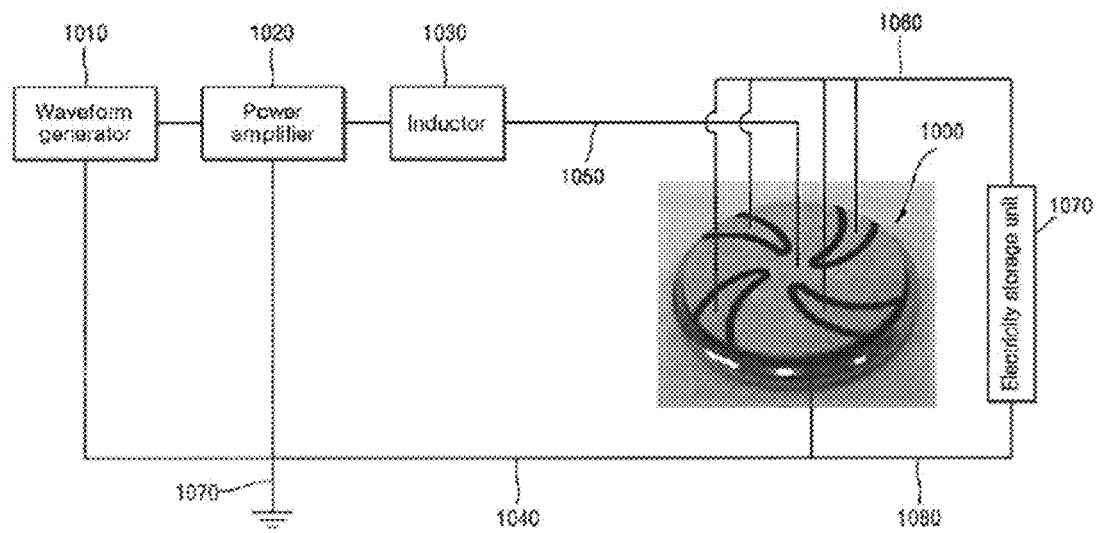
FIG. 22 is a block diagram of a system for driving an ultrasonic motor having a simple shape according to another embodiment of the present invention.

Next, FIG. 22 is a block diagram of a system for driving an ultrasonic motor having a simple shape according to another embodiment of the present invention.

Referring to FIG. 22, the system of FIG. 22 has the same fundamental configuration as that of the system shown in FIG. 21, and is configured to apply voltage only to an internal first electrode of a piezoelectric actuator 1000. On the other hand, a plurality of divided second electrodes is connected to an output voltage applying wire 1060 for transferring electric energy produced by a displacement (mechanical energy) generated upon vibration of the piezoelectric actuator.

Thus, the produced electric energy is stored in an electricity storage unit 1070 capable of accumulating electric energy, and thus may be used to apply input voltage in a subsequent process.

Further, the ultrasonic motor according to this embodiment includes only a piezoelectric actuator and two rotors. Thus, since the ultrasonic motor does not need conventional bearings or other driving units, a motor having a very simple structure can be produced.

Although several exemplary embodiments have been described, the embodiments are provided for illustration only and are not restrictive. For example, although it has been illustrated that the number of pinwheel wing-shaped electrode is 4, the number of pinwheel wing-shaped electrodes operable in a torsional vibration mode may be made 3 or 5 by varying the lengths of the electrodes from the central point of the piezoelectric actuator.

The rotating direction of the pinwheel may be the clockwise direction or the counterclockwise direction. Further, although the body has been illustrated as having a circular or annular planar structure, the body may have various shapes such as a tetragonal or a hexagonal shape.

In addition, the present invention may include an electrode structure capable of varying the lengths of the electrodes from the central point of the piezoelectric actuator.

In this way, it will be understood by those skilled in the art that various changes and modifications can be made without departing from the scope of the present invention as set forth in the attached claims.

The invention claimed is:

1. A piezoelectric actuator for an ultrasonic motor, comprising:

a plate-shaped body formed of a piezoelectric material;

a first electrode having a pinwheel wing shape formed on one of upper and lower surfaces of the plate-shaped body and operable in a torsional vibration mode by varying lengths of the electrode wings from a central point of the piezoelectric actuator;

a plurality of second electrodes formed between the pinwheel wings to be separated from the first electrode;

a third electrode formed on a surface opposite the surface on which the first electrode and the plurality of second electrodes are formed; and a side groove formed in a circular shape along a side surface of the plate-shaped body, wherein one of the first electrode and the plurality of second electrode is connected to an input voltage, wherein an electrode of the first electrode and the plurality of seconds electrodes to which the input voltage is not connected, and wherein the third electrode is connected to a common ground.

2. The piezoelectric actuator according to claim 1, wherein the plate-shaped body has a circular planar shape.

3. The piezoelectric actuator according to claim 1, wherein the pinwheel wings realize the torsional vibration mode in one direction by varying the lengths of the electrode wings from the center of the piezoelectric actuator.

4. The piezoelectric actuator according to claim 1, wherein the pinwheel wings are rotated in one direction.

5. The piezoelectric actuator according to claim 1, wherein the number of pinwheel wings is 3 to 8.

6. The piezoelectric actuator according to claim 1, further comprising:

at least one of: i) a hole passing through the plurality of second electrodes, the plate-shaped body, and the third electrode; ii) a vertical groove formed by cutting edges of the plurality of second electrodes, the plate-shaped body, and the third electrode at the same time; and iii) a boss formed on the side surface of the plate-shaped body.

7. The piezoelectric actuator according to claim 1, wherein a polarization direction of the plate-shaped body is a thickness direction thereof.

8. An ultrasonic motor comprising:
a plate-shaped body formed of a piezoelectric material;
a first electrode having a pinwheel wing shape formed on one of upper and lower surfaces of the plate-shaped body and operable in a torsional vibration mode by varying lengths of the electrode wings from a central point of the piezoelectric actuator;
a plurality of second electrodes formed between the pinwheel wings to be separated from the first electrode;
a third electrode formed on a surface opposite the surface on which the first electrode and the plurality of second electrodes are formed;
a side groove formed in a circular shape along a side surface of the plate-shaped body;
a ring-shaped rotor mounted on the side groove;
an input wire bonded to at least one of the first electrode and the plurality of second electrodes;
an output wire bonded to an electrode of the first electrode and the plurality of second electrodes to which the input wire is not bonded; and
an input/output common wire bonded to the third electrode.

9. The ultrasonic motor according to claim 8, wherein the rotor has a spring shape, a portion of which is cutaway.

10. The ultrasonic motor according to claim 8, wherein the rotor comprises two separated semi-annular rotors, each of the semi-annular rotors comprising an internal boss capable of contacting the side groove of the body on an inner surface thereof, and a securing boss capable of being coupled to a resilient securing ring on an outer surface thereof.

11. An ultrasonic motor comprising:
a plate-shaped body formed of a piezoelectric material;
a first electrode having a pinwheel wing shape formed on one of upper and lower surfaces of the plate-shaped body and operable in a torsional vibration mode;
a plurality of second electrodes formed between the pinwheel wings to be separated from the first electrode;
a third electrode formed on a surface opposite the surface on which the first electrode and the plurality of second electrodes are formed;
a side groove formed in a circular shape along a side surface of the plate-shaped body;
a ring-shaped rotor mounted on the side groove; and
through-holes formed through the plurality of second electrodes to guide voltage applying wires bonded to the first electrode and the plurality of electrodes to a lower side of the plate-shaped body to allow smooth rotation of the wires,
wherein the wires are bonded to the first and second electrodes such that an input voltage is applied to all of the plurality of second electrodes, or an input voltage is applied to some of the first electrode and the plurality of second electrodes and an output voltage is obtained from the remaining second electrodes, and an electric wire for applying an input/output common voltage is connected to the third electrode.

12. The ultrasonic motor according to claim 11, wherein the rotor has a spring shape, a portion of which is cutaway.

13. The ultrasonic motor according to claim 11, wherein the rotor comprises two separated semi-annular rotors, each of the semi-annular rotors comprising an internal boss capable of contacting the side groove of the body on an inner surface thereof, and a securing boss capable of being coupled to a resilient securing ring on an outer surface thereof.

14. An ultrasonic motor comprising:
a plate-shaped body formed of a piezoelectric material;
a first electrode having a pinwheel wing shape and formed on one of upper and lower surfaces of the plate-shaped body;
a plurality of second electrodes formed between the pinwheel wings to be separated from the first electrode;
a third electrode formed on a surface opposite the surface on which the first electrode and the plurality of second electrodes are formed;
a side groove formed in a circular shape along a side surface of the plate-shaped body;
a ring-shaped rotor mounted on the side groove; and
vertical grooves formed at edges of the plurality of second electrodes to guide electric wires bonded to the first electrode and the plurality of electrodes to a lower side of the plate-shaped body to allow smooth rotation of the wires,
wherein the wires are bonded to the first and second electrodes such that an input voltage is applied to all of the plurality of second electrodes, or an input voltage is applied to some of the first electrode and the plurality of second electrodes and an output voltage is obtained from the remaining second electrodes, and an electric wire for applying an input/output common voltage is connected to the third electrode.

15. The ultrasonic motor according to claim 14, wherein the rotor has a spring shape, a portion of which is cutaway.

16. The ultrasonic motor according to claim 14, wherein the rotor comprises two separated semi-annular rotors, each of the semi-annular rotors comprising an internal boss capable of contacting the side groove of the body on an inner surface thereof, and a securing boss capable of being coupled to a resilient securing ring on an outer surface thereof.

17. An ultrasonic motor comprising: a plate-shaped body formed of a piezoelectric material;
a first electrode having a pinwheel wing shape formed on one of upper and lower surfaces of the plate-shaped body;
a plurality of second electrodes formed between the pinwheel wings to be separated from the first electrode;
a third electrode formed on a surface opposite the surface on which the first electrode and the plurality of second electrodes are formed;
a boss formed along a side surface of the plate-shaped body to increase rotational force when torsion is applied to the plate-shaped body; and
a ring-shaped rotor mounted on the side groove and surrounding the boss,
wherein the wires are bonded to the first and second electrodes such that an input voltage is applied to all of the plurality of second electrodes, or an input voltage is applied to some of the first electrode and the plurality of second electrodes and an output voltage is obtained from the remaining second electrodes, and an electric wire for applying an input/output common voltage is connected to the third electrode.

18. The ultrasonic motor according to claim 17, wherein the rotor has a spring shape, a portion of which is cutaway.

19. The ultrasonic motor according to claim 17, wherein the rotor comprises two separated semi-annular rotors, each of the semi-annular rotors comprising an internal boss capable of contacting the side groove of the body on an inner surface thereof, and a securing boss capable of being coupled to a resilient securing ring on an outer surface thereof.

* * * * *